(12) United States Patent
Yeung et al.

(10) Patent No.: US 8,848,412 B1
(45) Date of Patent: Sep. 30, 2014

(54) TERNARY CONTENT ADDRESSABLE MEMORY

(71) Applicant: Arm Limited, Cambridge (GB)

(72) Inventors: Gus Yeung, Austin, TX (US); Yew Keong Chong, Austin, TX (US); Wang-Kun Chen, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/935,710

(22) Filed: Jul. 5, 2013

(51) Int. Cl.
*G11C 15/00* (2006.01)
*G11C 11/56* (2006.01)
*G11C 15/04* (2006.01)

(52) U.S. Cl.
CPC ............... *G11C 15/00* (2013.01); *G11C 11/56* (2013.01); *G11C 15/04* (2013.01)
USPC ...................... 365/49.1; 365/49.17

(58) Field of Classification Search
CPC ...... G11C 15/04; G11C 15/00; G11C 15/046; G11C 11/56; G06F 17/30982; H04L 45/7457
USPC .............................................. 365/49.1, 49.17
See application file for complete search history.

(56) References Cited

U.S. PATENT DOCUMENTS

| | | | |
|---|---|---|---|
| 8,355,269 B1 * | 1/2013 | Zampaglione | 365/49.16 |
| 8,625,320 B1 * | 1/2014 | Argyres | 365/49.1 |
| 8,724,359 B2 * | 5/2014 | Fabry | 365/49.1 |
| 2012/0063189 A1 * | 3/2012 | Maurya et al. | 365/49.17 |

* cited by examiner

*Primary Examiner* — Fernando Hidalgo
(74) *Attorney, Agent, or Firm* — Nixon & Vanderhye P.C.

(57) ABSTRACT

A ternary content addressable memory (TCAM) has at least one TCAM cell comprising first and second memory bitcells for storing first and second bit values representing a cell state comprising one of a first cell state, a second cell state and a mask cell state. The first and second memory bitcells share a pair of bitlines for accessing the first and second bit values. Access control circuitry is provided for triggering, in response to a clock signal, a read or write access to the first memory bitcell during a first portion of a clock cycle and triggering a read access or write access to the second read bitcell during a second portion of the clock cycle.

16 Claims, 5 Drawing Sheets

| TCAM cell state | node A (top) | node B (bottom) |
|---|---|---|
| 0 | 0 | 1 |
| 1 | 1 | 0 |
| dc | 0 | 0 |
| illegal | 1 | 1 |

FIG. 2

| search state | sl | nsl |
|---|---|---|
| 0 | 0 | 1 |
| 1 | 1 | 0 |
| dc | 0 | 0 |
| illegal | 1 | 1 |

FIG. 3

| match line | TCAM cell state | search state |
|---|---|---|
| 0 | 0 | 1 |
| 0 | 1 | 0 |
| 1 | 0 | 0 |
| 1 | 1 | 1 |
| 1 | dc | x |
| 1 | x | dc |

FIG. 4

Write

Search

TERNARY CONTENT ADDRESSABLE MEMORY

BACKGROUND TO THE INVENTION

1. Field of the Invention

The present invention relates to a ternary content addressable memory.

2. Description of the Prior Art

A content addressable memory (CAM) is a form of memory that can be searched based on the content stored in the memory. In contrast to a standard memory which is searched by inputting an address identifying the memory location at which the required data value is stored, for a content addressable memory a data value is input and the CAM searches its memory locations to see whether that data value is stored. If the data value is stored, then an indication of the location storing the data value is output.

Ternary content addressable memory (TCAM) is a form of content addressable memory in which each memory cell can store one of three states—the 0 and 1 states of a binary content addressable memory and an additional "don't care" state which is considered to match against either 0 or 1 when the TCAM is searched. Similarly, a "don't care" value can be input to the TCAM when searching, and any bits set to "don't care" will be considered to match against a corresponding stored bit irrespective of the state of the stored bit. A TCAM is useful for searching for any of a set of data values which share some but not all bit values, in a single search operation.

The present technique aims to provide an improved ternary content addressable memory.

SUMMARY OF THE INVENTION

Viewed from one aspect, the present invention provides a ternary content addressable memory (TCAM) comprising:

at least one TCAM cell comprising:

first and second memory bitcells configured to store first and second bit values representing a cell state comprising one of a first cell state, a second cell state and a mask cell state;

a shared pair of bitlines shared by the first and second memory bitcells for accessing the first and second bit values stored by the first and second memory bitcells;

a pair of search lines for inputting first and second search values representing a search state comprising one of a first search state, a second search state and a mask search state;

compare circuitry configured to generate a match value indicating a result of comparing the search state of the first and second search values with the cell state of the first and second bit values; and a match line configured to output the match value; and access control circuitry configured, in response to a clock signal, to trigger a read access or write access to the first memory bitcell via the shared pair of bitlines during a first portion of a clock cycle of the clock signal, and to trigger a read access or write access to the second memory bitcell via the shared pair of bitlines during a second portion of said clock cycle of the clock signal.

A ternary content addressable memory (TCAM) has at least one TCAM cell comprising first and second memory bitcells configured to store first and second bit values respectively. Since there are three available states for each TCAM cell, two bit values are stored for each TCAM cell, which together represent a cell state comprising one of a first cell state, a second cell state and a mask cell state. A pair of search lines are provided for inputting first and second search values which together represent a search state comprising one of a first search state, a second search state and a mask search state. Compare circuitry compares the cell state with the search state and generates a match value on a match line indicating the outcome of the comparison.

The first and second memory bitcells have a shared pair of bitlines for accessing the first and second bit values stored in the first and second memory bitcells. By sharing the same pair of bitlines between the two memory bitcells, the area and routing track of the TCAM cell is reduced. This allows the TCAM cell to be implemented more efficiently. However, sharing bitlines between the first and second memory bitcells means that it is not possible to simultaneously access the bit values in both the first and second memory bitcells. Accessing the first and second bit values over several clock cycles slows TCAM accesses, which may not be acceptable for the system including the TCAM, which may require frequent TCAM lookups. Also, providing a faster clock signal may not be possible as other system components may not be able to operate at a faster rate. Therefore, access control circuitry is provided to trigger a read or write access to the first memory bitcell via the shared pair of bitlines during the first portion of a clock cycle and trigger a read or write access to the second memory bitcell via the shared pair of bitlines during the second portion of the clock cycle of the clock signal. Hence, the use of the shared bitlines and the doubling of the access rate using the access control circuitry provides an area-efficient TCAM while maintaining performance.

The first and second portions of the clock cycle may occur in either order. In some embodiments, the first memory bitcell may be accessed before the second memory bitcell, while in other embodiments the second memory bitcell may be accessed first and the first memory bitcell accessed afterwards.

The read and write accesses may be performed separately from, or at the same time as, searching the compare circuitry. The compare circuitry may use different access lines to the bitlines used for the read or write accesses. A write access may write first and second bit values to the first and second memory bitcells via the bitlines to update the cell state represented by the TCAM cell. The read access may read current values of the first and second bit values from the first and second bitcells via the bitlines. The read and write accesses may be based on a memory address identifying the TCAM cell to be read or written, in contrast to the searching based on the stored state itself using the compare circuitry.

The access control circuitry may have a pulse generator for generating, in response to the clock signal, a pulse signal having a first pulse corresponding to the first portion of the clock cycle and a second pulse corresponding to the second portion of the clock cycle. In this way, a local pulse signal can be used to trigger the read and write accesses to the respective first and second bitcells, so that it is unnecessary to provide a faster external clock to the TCAM cell. This makes it easier to integrate the TCAM with other circuit components since the internal pulse generator enables the TCAM cell to operate at double speed while receiving the same clock signal used by other components.

The first and second memory bitcells may each have a corresponding wordline which is used to select that bitcell for a read or write operation. The access control circuitry may activate the first wordline and deactivate the second wordline during the first portion of the clock cycle, and deactivate the first line and activate the second line during the second portion of the clock line. This enables the same pair of bitlines to be used to read or write one of the first and second memory bitcells without affecting the state stored by the other bitcell.

To reduce the circuit area of the TCAM, a diffusion node of the match line may be shared between the first and second memory bitcells. This avoids duplication of the diffusion node of the match line and helps to reduce match line capacitance, which is significant in reducing power consumption of the TCAM.

The bitlines may run parallel to each other and to the search lines, and perpendicular to the wordlines and the match line. The longitudinal direction of the bitlines may define a vertical direction and the longitudinal direction of the match line may define a horizontal direction. The first and second memory bitcells may be arranged adjacent to each other in the vertical direction. The first and second memory bitcells may have substantially rectangular boundaries, and respective horizontal edges of the first and second memory bitcells may abut against each other so that the first and second memory bitcells are stacked one above the other in the vertical direction, to produce a double-high cell which is twice as high as a standard memory cell. This physical arrangement of the memory bitcells enables the area and energy consumption of the TCAM cell to be reduced, because typically memory bitcells are wider in the horizontal direction than in the vertical direction. If the memory bitcells were adjacent to each other in the horizontal direction (a double-wide cell) then the match line would span both memory bitcells in the horizontal direction, resulting in a longer match line than when the cells are adjacent in the vertical direction when the width of the match line is equivalent to one memory bitcell per TCAM cell. Most of the dynamic power consumption of the TCAM comes from dynamic compare, which consists of charging and the evaluating the state of the match lines. Reducing the length of the match line (and hence its capacitance) reduces the power consumed in charging and discharging the match line and also improves the performance of the dynamic compare. Therefore, stacking the first and second memory bitcells vertically rather than horizontally enables performance to be improved and power consumption to be reduced.

The first and second memory cells may have foundry-provided bitcell layouts. A silicon foundry typically provides a number of standard bitcell layouts which have been optimised for area and performance, for example using pushed-rule design techniques. Therefore, foundry-provided bitcell layouts are often more efficient terms of area and performance than other types of cell designs. Hence, by using a standard foundry-provided bitcell layout as the basis for the first and second memory bitcells, the TCAM cell can be implemented more efficiently.

For example, the first and second memory bits may comprise static random access memory (SRAM) bitcells. SRAM bitcells typically store a bit value using a pair of cross-coupled inverters. A pair of SRAM bitcells can be used to store the two bit values representing the ternary states of the TCAM cell.

More particularly, the first and second memory bitcells may have an 8-transistor SRAM bitcell layout. For example, the bitcells may each have an 8-transistor 1 read, 1 write (8T 1r1w) SRAM bitcell layout. In an 8T 1r1w SRAM bitcell layout, separate read and write ports are provided for accessing the bit value stored by the SRAM cell. The 8 transistors comprise 4 transistors forming cross-coupled inverters for storing the bit value, 2 transistors forming a write port for writing a bit value to the cell via the bitlines and 2 further transistors forming a read port for reading the bit value from the bitcell independently of the bitlines. Providing a separate read port can be useful to improve the read stability of the SRAM cell, making it less likely that a read access to a bitcell causes the bitcell to switch states.

The 8T 1r1w layout can efficiently be used to provide the functionality required for the TCAM cell by reusing the transistors corresponding to the read port of the 8T 1r1w SRAM cell layout to provide a portion of the compare circuitry. Since the read port is already provided in such a cell layout to access the bit value in the cross coupled inverters, the transistors from the read port can also be used to search the contents of the cell state based on search values provided by the search lines. The read ports of the respective first and second memory bits cells together make up the compare circuitry. Meanwhile, the bitlines which would normally be used only for writes in a conventional 8T 1r1w SRAM cell can be reused for both read and write accesses in the TCAM cell. While some routing modification may be required to route the search lines to the gates of the transistors in the read ports, the transistor layout itself can be the same as in the foundry-provided 8T 1r1w cell, as optimised by the foundry, so as to provide an efficient implementation of the TCAM cell. By using an 8-transistor foundry-provided cell layout, the compare circuitry can be formed from transistors whose layout has already been optimised by the foundry, unlike if a 6-transistor cell layout was used as the basis for the first and second memory cells, in which case additional edge cells which have not been optimised by the foundry would be required to provide the compare functionality.

The compare circuitry implements a ternary comparison of the cell state represented by the stored first and second bit values of the TCAM cell and the search state represented by the search values placed on the search lines. The match signal may be generated with a mismatch value if the TCAM cell stores the first cell state and the search values represent the second search state, or if the TCAM cell stores the second cell state and the search values represent the first cell search state. Otherwise, the match signal may be generated with a match value indicating that the cell state matched the search state. If either the cell state or the search state is set to the mask state, then a match will be signalled regardless of the other state.

The first and second bit values together represent the first cell state. Various encodings of the first state may be used. However, an efficient encoding which can be provided with little routing modification to the foundry-provided 8T 1r1w cell layout is achieved if the first cell state is represented by the first bit value having a first value and the second bit value having a second value, the second cell state is represented by the first bit value having the second value and the second bit value having the first value, and the mask cell state is represented by the first and second bit values both having the first value. The first and second values may be 1 and 0, or 0 and 1, respectively.

The first and second search values may be encoded in a corresponding way so that the first and second search states are encoded by the first and second search values having opposite states (a first value and second value respectively) and the mask search state is represented by the first and second search values both having the first value.

Viewed from another aspect, the present invention provides a ternary content addressable memory (TCAM) comprising:

at least one TCAM cell means for storing a cell state, comprising:

first and second memory bitcell means for storing first and second bit values representing the cell state comprising one of a first cell state, a second cell state and a mask cell state;

a shared pair of bitline means for accessing the first and second bit values stored by the first and second memory bitcell means, wherein the shared pair of bitline means is shared by the first and second memory bitcell means;

a pair of search line means for inputting first and second search values representing one of a first search state, a second search state and a mask search state;

comparing means for generating a match value indicating a result of comparing the search state of the first and second search values with the cell state of the first and second bit values; and match line means for outputting the match value; and access control means for triggering, in response to a clock signal, a read access or write access to the first memory bitcell means via the shared pair of bitline means during a first portion of a clock cycle of the clock signal, and triggering a read access or write access to the second memory bitcell means via the shared pair of bitline means during a second portion of said clock cycle of the clock signal.

Viewed from a further aspect, the present invention provides a method of operating a ternary content addressable memory (TCAM) cell comprising first and second memory bitcells configured to store first and second bit values representing a cell state comprising one of a first cell state, a second cell state and a mask cell state; a shared pair of bitlines shared by the first and second memory bitcells for accessing the first and second bit values stored by the first and second memory bitcells; a pair of search lines for inputting first and second search values representing a search state comprising one of a first search state, a second search state and a mask search state; compare circuitry configured to generate a match value indicating a result of comparing the search state of the first and second search values with the cell state of the first and second bit values; and a match line configured to output the match value;

the method comprising:

receiving a clock signal;

triggering a read access or a write access to the first memory bitcell via the shared pair of bitlines during a first portion of a clock cycle of the clock signal, and triggering a read access or write access to the second memory bitcell via the shared pair of bitlines during a second portion of said clock cycle of the clock signal.

The above, and other objects, features and advantages of this invention will be apparent from the following detailed description of illustrative embodiments which is to be read in connection with the accompanying drawings.

BRIEF DESCRIPTION OF THE DRAWINGS

FIG. 2 illustrates an encoding of a TCAM cell state represented by first and second bit values;

FIG. 3 illustrates an encoding of a search state represented by first and second search values;

FIG. 4 illustrates a match value generated based on different comparisons of the TCAM cell state and the search state;

DESCRIPTION OF EXAMPLE EMBODIMENTS

Figure 1:
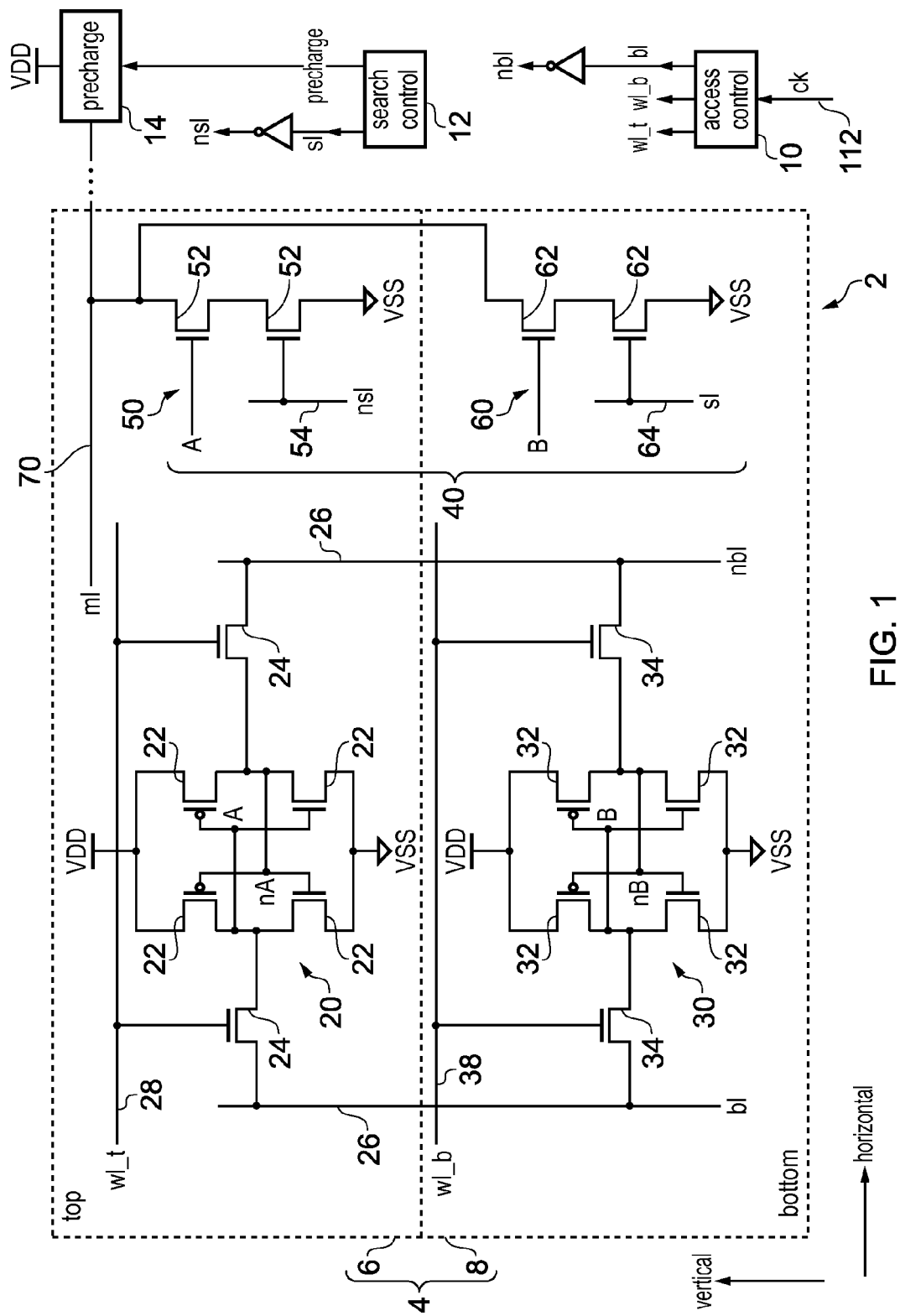
FIG. 1 illustrates a ternary content addressable memory (TCAM)

FIG. 1 schematically illustrates a ternary content addressable memory (TCAM) 2. FIG. 1 shows a single TCAM cell 4 which comprises a top SRAM cell 6 and a bottom SRAM cell 8. The top and bottom SRAM cells 6, 8 are standard foundry-provided TP bitcells having an 8T 1r1w transistor layout. The SRAM cells 6, 8 are stacked vertically, one above the other. The TCAM 2 has many such TCAM cells 4 arranged in an array for storing respective cell states. The TCAM 2 has access control circuitry 10 for controlling read accesses for a reading a cell state from the TCAM cell 4, and write accesses for writing a cell state to the TCAM cell 4. The TCAM 2 also has search control circuitry 12 for controlling content searching of the TCAM 2 and precharge circuitry 14 for matchline pre-charging.

The top SRAM cell 6 has a latch 20 formed of a pair of cross coupled inverters. Four transistors 22 form the latch 20, including two Pmos transistors and two Nmos transistors. The voltage level at node A of the latch 20 represents a first bit value stored by the latch 20. Two access control transistors 24 are provided for selectively coupling the latch 20 to a pair of bitlines 26 for performing read and write accesses to the latch 20. A top wordline (wl_t) 28 is controlled by access control circuitry 10 to select whether the access transistors 24 are on or off.

Similarly, the bottom SRAM cell 8 has a latch 30 comprising four transistors 32 forming a pair of cross-coupled inverters. The voltage level at a node B represents a second bit value stored by the latch 30. Access control transistors 34 couple the latch 30 to the same bitlines 26 that are used for accessing the top SRAM cell 6. Hence, the bitlines 26 are shared between the two cells 6, 8. A bottom wordline (wl_b) 38 is controlled by access control circuitry 10 to set whether the access control transistors 34 couple the latch 30 to the bitlines 26.

The first and second bit values stored by the latches 20, 30 in the top and bottom SRAM cells 6, 8 together represent a TCAM cell state stored by the TCAM cell 4. FIG. 2 illustrates a mapping between the voltage levels at nodes A and B and the TCAM cell state represented by the TCAM cell 4 as a whole. As shown in FIG. 2, when nodes A and B have opposite voltage levels, then the TCAM cell state is binary 0 or binary 1, depending on which of nodes A and B is high and which is low. However, when both nodes A and B are 0 then the TCAM cell state is "dc" (don't care), also referred to as the mask state. The dc state indicates that the TCAM cell state should be determined to match against any search state that is compared against it. The state in which both nodes A and B are at logical 1 is an illegal state which cannot be stored to the TCAM cell 4.

The TCAM cell 4 has compare circuitry 40 which is formed of the transistors corresponding to a read port 50 in the top SRAM cell 6 and a read port 60 in the bottom SRAM cell 8. Each of the read ports 50, 60 is formed of a pair of transistors 52 or 62, one of which is coupled to the storage node A, B of the corresponding latch 20, 30 and the other of which is coupled to one of a pair of search lines 54, 64. The search lines 54, 64 input first and second search values representing a search state to be compared against the TCAM cell state stored by the TCAM cell 4. In a standard 8T 1r1w bitcell, the read ports 50, 60 would be used for standard address-based read operations, but in the TCAM cell 4, some routing modifications are made to cause the read ports 50, 60 to function as the compare circuitry 40 (for example, compared to the standard layout, the transistors 52, 62 may be coupled to the search lines 54, 64 instead of the word lines 28, 38).

Search control circuitry 12 controls the values driven on the search lines 54, 64. As shown in FIG. 3, different search states can be represented by driving different values onto the search lines 54, 64. The encoding of the search state shown in FIG. 3 is similar to the encoding of the TCAM cell state shown in FIG. 2. When the search lines 54, 64 have opposite states then this represents search states of 0 and 1. The "don't care" mask state (dc) is represented when the search lines both have a logical 0 value. Again, the state where both search lines are at logical 1 is illegal.

The compare circuitry 40 generates a match value which is output via a match line 70 to indicate the result of comparing the TCAM cell state stored in the TCAM cell 4 with the search state represented by the values on the search lines 54, 64. When performing a content-addressable search, the search control circuitry 12 controls the precharge circuitry 14 to precharge match line 70 to logical 1 (VDD voltage level). The compare circuitry 40 compares the stored cell state with the input search state and causes the match value on the match line 70 to drop to logical 0 (VSS voltage level) if there is a mismatch between the TCAM cell state and the search state such that one of these states is 0 and the other state is 1. Otherwise, the match line 70 remains at logical 1 indicating a match.

FIG. 4 shows the possible outcomes of the TCAM comparison. As shown in FIG. 1, the transistors 52 will pull down the match value on the match line 70 if both the nsl search line 54 and the node A of top SRAM cell 6 are at logical 1. As shown in FIGS. 2 and 3, this will occur when the TCAM cell state is 1 and the search state is 0 (i.e. mismatching states). Hence, the second row of FIG. 4 shows that this combination of TCAM cell state and search state causes the match line to drop to 0.

Similarly, the transistors 62 of the read port 60 in the bottom cell 8 will only pull the match line 70 down to 0 if both node B and the sl search line 64 are at logical 1. As shown in FIGS. 2 and 3, this occurs when the TCAM cell state is 0 and the search state is 1 (again, mismatching states). Therefore, this combination of TCAM cell state and search state will cause the match value to be pulled down to 0 as shown in the first row of FIG. 4.

In all other cases, at least one of transistors 52 will remain off and at least one of transistors 62 will remain off. Therefore, the match line remains at the precharged level of 1 in all other cases as shown in third to sixth rows of FIG. 4. When the stored cell state is "don't care" then both nodes A and B will be at logical 0 and so one transistor in each of the compare circuitry 40 will remain off. Similarly, if the search state is "don't care" then both the search lines 54, 64 will have logic 0 level causing one of each pair of transistors 52, 62 to stay off. Therefore, the match line 70 stays high. Hence, the cell shown in FIG. 1 implements the correct ternary content comparison required for a TCAM.

Figure 5:
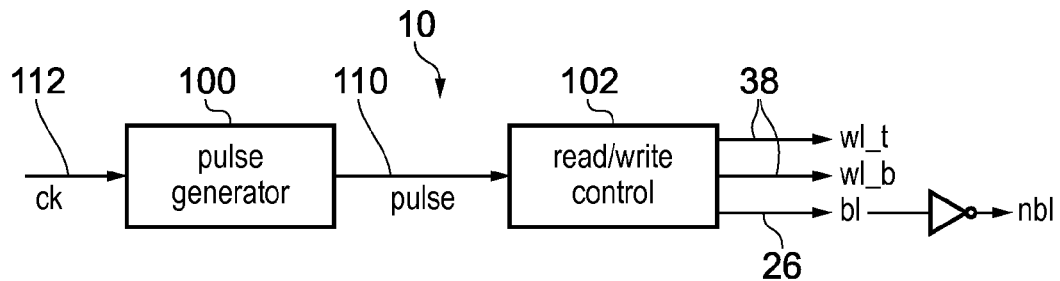
FIG. 5 illustrates access control circuitry for controlling read and write accesses to the TCAM cell.

FIG. 5 shows an example of the access control circuitry 10 having a pulse generator 100 and read/write control circuitry 102. The pulse generator 100 generates a pulse signal 110 from an input clock signal 112 received by the TCAM 2. The read/write control circuitry 102 generates values to be driven on the bitlines 26 and the wordlines 28, 38 based on the pulse signal 110. The bitlines 26 include a first bitline bl and a second bitline nbl which during a write operation is driven with the inverse state compared to bl.

Figure 6:
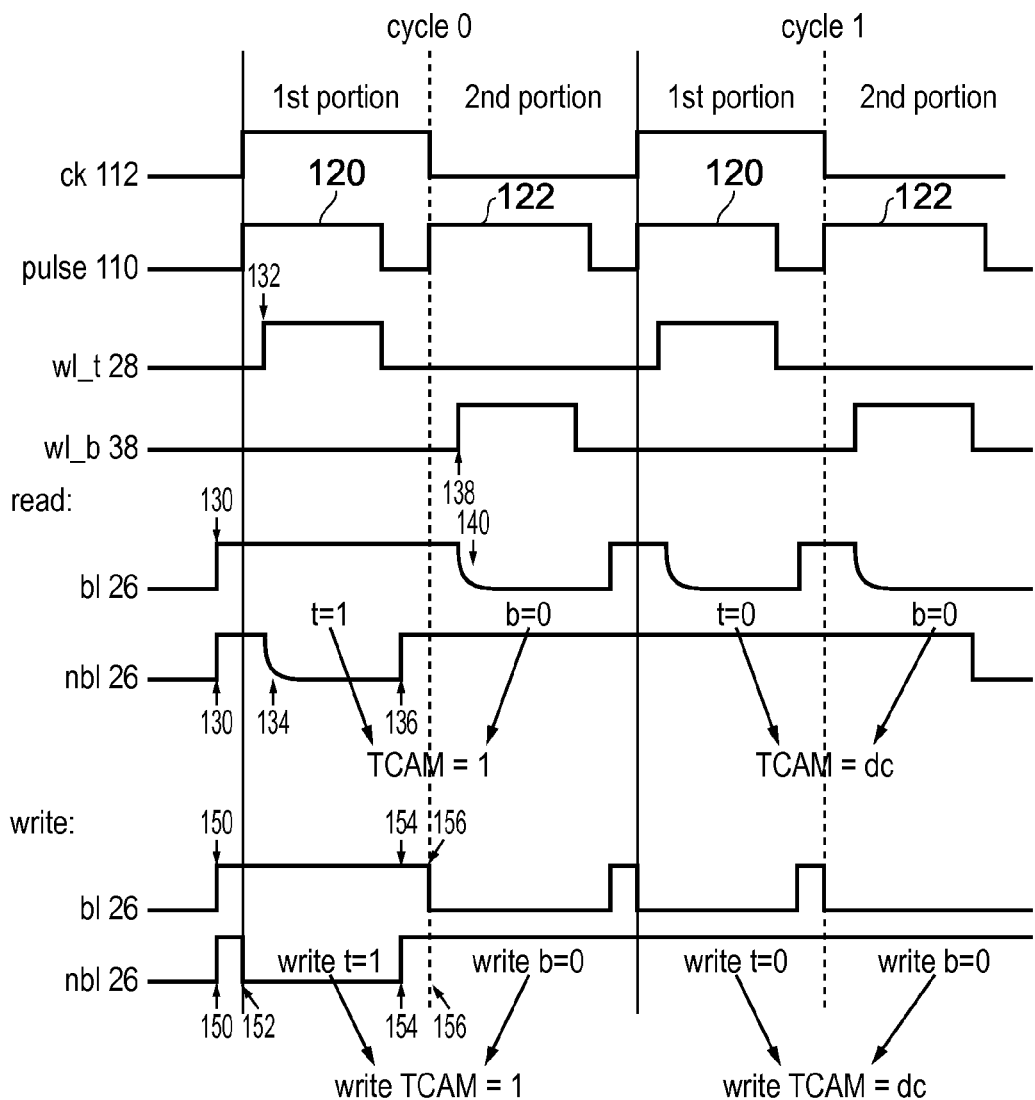
FIG. 6 is a timing diagram illustrating timings of read and write accesses controlled by the access control circuitry.

FIG. 6 shows a timing diagram illustrating the levels of the clock signal 112 the pulse signal 110, the wordlines 28, 38 and the bitlines 26 during a read operation and a write operation respectively. As shown in FIG. 6, the input clock signal 112 defines a number of clock cycles, each clock cycle having a first portion and a second portion. The pulse signal 110 is generated with a first pulse 120 during a first portion of a clock cycle and a second pulse 122 during a second portion of the clock cycle. For example, the first pulse 120 may be generated in response to a rising edge of the clock signal and the second pulse 122 may be generated in response to a falling edge of the clock signal.

During a read operation for reading the TCAM cell state from the TCAM cell 4, the bitlines 26 are precharged prior to the start of a clock cycle (see arrow 130). Hence, both bitlines 26 are set to 1. In response to the first pulse 120, the top wordline 28 is activated at arrow 132 and this causes the access transistor 24 to turn on, coupling the latch 22 to the bitlines 26. Depending on which of nodes A and nA is at logical 1 and which is at logical 0, one of the bitlines 26 will now drop to 0. In cycle 0 of the example shown in FIG. 6, the nbl bitline drops low at arrow 134. The value 1 on the bl bitline 26 which is connected to the node A is taken as the first bit value of the top SRAM cell 6.

Prior to the start of the second portion of the clock cycle at arrow 136, both bitlines 26 are precharged high once more in preparation for a second read operation of the bottom cell 8. In response to the second pulse 122 of the pulse signal 110, the access control circuitry 10 asserts the bottom wordline 38 at arrow 138 and again this triggers one of the bitlines 26 to drop low. In this example, node B is low and pulls bitline bl low at arrow 140. The value 0 on bitline bl is taken as the second bit value stored by the bottom cell 8. As shown in FIG. 2, since the first bit value of the top cell is 1 and the second bit value of the bottom cell is 0, the TCAM cell state is binary 1. In cycle 1 of FIG. 6, another read is performed for both SRAM cells to read a TCAM cell state of dc. It will be appreciated that the read in cycle 1 may be to a different TCAM cell to the read in cycle 0. Different TCAM cells can be selected by driving different bitlines and wordlines corresponding to the row and column including the cell.

FIG. 6 also shows how write operation may be performed. At arrow 150, both bitlines 26 are precharged high. At arrow 152, at the start of the clock cycle the bitlines 26 are driven with the values to be written to the top SRAM cell 6. Bitline bl is driven with the value to be written to node A and bitline nbl 26 is driven with the inverse value to be written to inverse node nA. In response to the first pulse 120 of the pulse signal 110, the top wordline 28 is asserted at arrow 132 and this causes access transistors 24 to become conductive so that the values on the bitlines 26 are written into the latch 20. Prior to the start of the second portion of the clock cycle the bitlines 26 are once more precharged at arrow 154. At the start of the second portion of the clock cycle as indicated by arrow 156, the access control circuitry 10 drives the bitlines 26 with the values to be written to nodes B and nB of the bottom SRAM cell 8. At arrow 138, in response to the second pulse 122, the bottom wordline 28 is asserted to open access transistors 34 and write the values from the bitlines 26 to nodes B, nB of the latch 30 in the bottom cell 8. In this example the first bit value stored to the top cell is binary 1 and the second bit value stored to the bottom cell is binary 0, indicating a TCAM cell state of 1. In cycle 1 illustrated in FIG. 6, the write operation is controlled in a similar way to cycle 0.

Hence, the pulse generator 100 enables read or write operations to both the top and bottom cells 6, 8 to be carried out in the same processing cycle using a shared pair of bitlines 26. This speeds up the reading and writing the data to the TCAM cell 4 while avoiding duplication of bitlines which would lead to increased area. Hence the overall balance between performance and area is improved.

Figure 7:
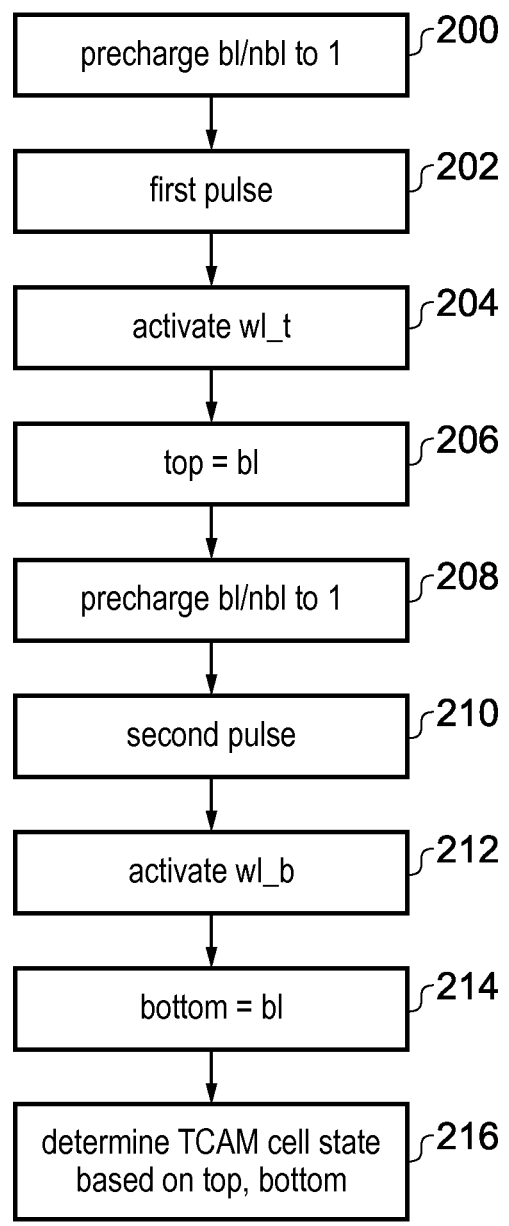
FIG. 7 illustrates a method of performing a read access to a TCAM cell.

FIG. 7 shows a method of performing a read access to the TCAM cell 4. At step 200, both bitlines 26 are precharged to logical 1. At step 202, the pulse generator 100 generates the first pulse 120 of the pulse signal 110. In response to the first pulse 120, at step 204 the top wordline 28 is activated. At step 206, the first bit value stored at node A in the latch 20 is detected from the value on the bl bitline 26.

At step 208, the top wordline 28 is deactivated and both bitlines 26 are precharged to logical 1 once more. At step 210, the pulse generator 100 generates the second pulse 122 of the pulse signal 110, which triggers the bottom wordline 38 to be activated at step 212. This causes access transistors 34 to switch on, coupling bitline bl to node B. The second bit value represented by node B is read out from bitline bl at step 214. At step 216, the TCAM cell state is determined based on the first and second bit values read at steps 206 and 214, using the mapping shown in FIG. 2.

Figure 8:
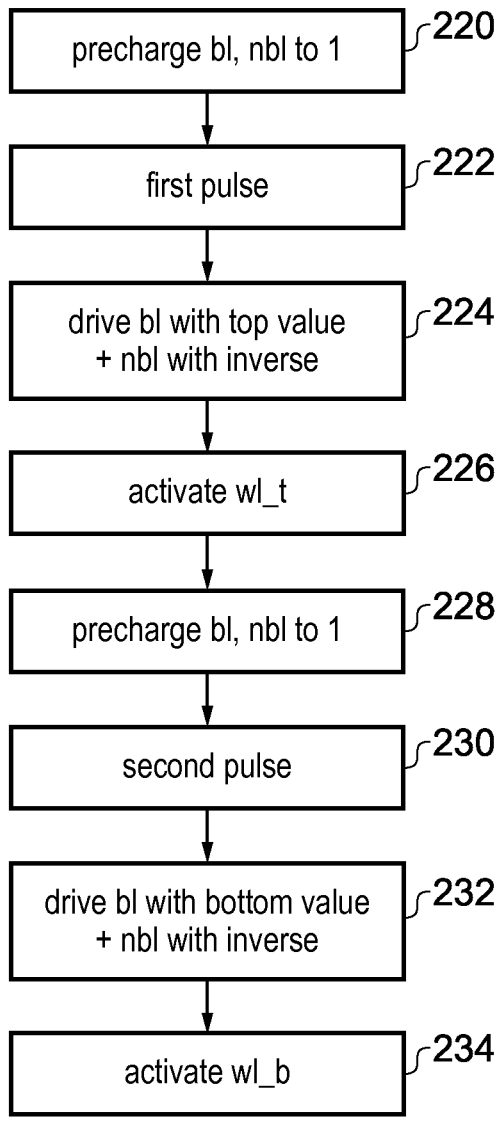
FIG. 8 illustrates a method of performing a write access to the TCAM cell.

FIG. 8 illustrates a method performing a write access to update the cell state stored by the TCAM cell 4. At step 220, both the bitlines 26 are precharged to logic level 1. At step 222, the pulse generator 100 generates the first pulse 120. At step 124, the first pulse 120 triggers the access control circuitry 10 to drive bitline bl with the new first bit value and to drive bitline nbl with the inverse value of the first bit value. At step 226, the top wordline 28 is activated and this causes the values on the bitlines 26 to be written to the latch 20 so that the latch node stores the desired top bit value. Having deactivated the top wordline 28, then at step 128 both bitlines 26 are precharged to 1 ahead of the write to the bottom bitcell 8. At step 230 the second pulse 122 is generated by the pulse generator 100. At step 232, bitline bl is driven with the second bit value to be written to the node B and bitline nbl is driven with its inverse value. At step 234, the bottom wordline 38 is activated and this causes latch 30 to be written with the values from the bitlines 26.

Figure 9:
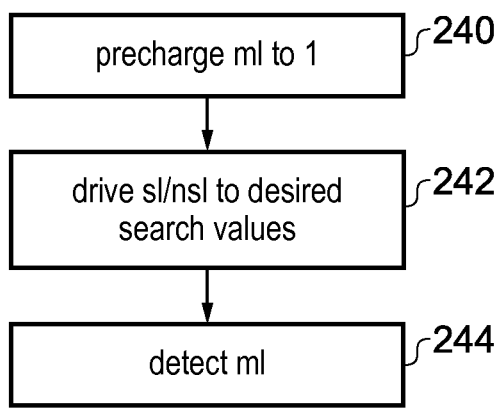
FIG. 9 illustrates a method of searching the TCAM cell for a desired search state.

FIG. 9 shows a method of performing a content search using the compare circuitry 40. At step 240, the match line 70 is precharged to logical 1 by precharge circuitry 14. At step 242, the search control circuitry 12 drives the search lines 54, 64 with the desired search values according to the encoding shown in FIG. 3. Transistors 52, 62 switch on or off depending on the current state of the TCAM cell 4 and the search line state. The state of the match line 70 is then detected at step 244 and this is used to determine whether there is a match or mismatch between the search state and cell state. By searching a number of cells simultaneously, ranges of data values with some shared bit values and some non-shared bit values can be searched in a single search operation by masking out the non-shared bit values using the "don't care" state.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A ternary content addressable memory (TCAM) comprising:
    at least one TCAM cell comprising:
        first and second memory bitcells configured to store first and second bit values representing a cell state comprising one of a first cell state, a second cell state and a mask cell state;
        a shared pair of bitlines shared by the first and second memory bitcells for accessing the first and second bit values stored by the first and second memory bitcells;
        a pair of search lines for inputting first and second search values representing a search state comprising one of a first search state, a second search state and a mask search state;
        compare circuitry configured to generate a match value indicating a result of comparing the search state of the first and second search values with the cell state of the first and second bit values; and
        a match line configured to output the match value; and
    access control circuitry configured, in response to a clock signal, to trigger a read access or write access to the first memory bitcell via the shared pair of bitlines during a first portion of a clock cycle of the clock signal, and to trigger a read access or write access to the second memory bitcell via the shared pair of bitlines during a second portion of said clock cycle of the clock signal.

2. The TCAM according to claim 1, wherein the access control circuitry comprises a pulse generator configured to generate, in response to the clock signal, a pulse signal having a first pulse corresponding to the first portion of the clock cycle and a second pulse corresponding to the second portion of the clock cycle.

3. The TCAM according to claim 2, wherein the access control circuitry is configured to trigger the read access or write access to the first memory bitcell in response to the first pulse and to trigger the read access or write access to the second memory bitcell in response to the second pulse.

4. The TCAM according to claim 1, wherein the TCAM cell comprises a first wordline corresponding to the first memory bitcell and a second wordline corresponding to the second memory bitcell; and
    the access control circuitry is configured to control the first and second wordlines such that the first wordline is active and the second wordline is inactive during the first portion of the clock cycle and the first wordline is inactive and the second wordline is active during the second portion of the clock cycle.

5. The TCAM according to claim 1, wherein a diffusion node of the match line is shared between the first and second memory bitcells.

6. The TCAM according to claim 1, wherein the shared pair of bitlines run in a vertical direction and the match line runs in a horizontal direction perpendicular to the vertical direction; and
    the first and second memory bitcells are adjacent to each other in the vertical direction.

7. The TCAM according to claim 1, wherein the first and second memory bitcells have foundry-provided bitcell layouts.

8. The TCAM according to claim 1, wherein the first and second memory bitcells comprise SRAM bitcells.

9. The TCAM according to claim 1, wherein the first and second memory bitcells each have an 8-transistor SRAM bitcell layout.

10. The TCAM according to claim 1, wherein the first and second memory bitcells each have an 8-transistor 1r1w SRAM bitcell layout.

11. The TCAM according to claim 10, wherein the compare circuitry comprises transistors of the first and second memory bitcells corresponding to a read port of the 8-transistor 1r1w SRAM bitcell layout.

12. The TCAM according to claim 1, wherein the compare circuitry is configured to generate the match signal having a mismatch value if the first and second bit values represent the first cell state and the first and second search values represent the second search state or if the first and second bit values represent the second cell state and the first and second search values represent the first search state, and otherwise to generate the match signal having a match value.

13. The TCAM according to claim 1, wherein the first and second bit values represent:

(i) the first cell state if the first bit value has a first value and the second bit value has a second value;
(ii) the second cell state if the first bit value has the second value and the second bit value has the first value; and
(iii) the mask cell state if the first and second bit values both have the first value.

14. The TCAM according to claim 1, wherein the first and second search values represent:
(i) the first search state if the first search value has a first value and the second search value has a second value;
(ii) the second search state if the first search value has the second value and the second search value has the first value; and
(iii) the mask search state if the first and second search values both have the first value.

15. A ternary content addressable memory (TCAM) comprising:
at least one TCAM cell means for storing a cell state, comprising:
first and second memory bitcell means for storing first and second bit values representing the cell state comprising one of a first cell state, a second cell state and a mask cell state;
a shared pair of bitline means for accessing the first and second bit values stored by the first and second memory bitcell means, wherein the shared pair of bitline means is shared by the first and second memory bitcell means;
a pair of search line means for inputting first and second search values representing one of a first search state, a second search state and a mask search state;
comparing means for generating a match value indicating a result of comparing the search state of the first and second search values with the cell state of the first and second bit values; and
match line means for outputting the match value; and
access control means for triggering, in response to a clock signal, a read access or write access to the first memory bitcell means via the shared pair of bitline means during a first portion of a clock cycle of the clock signal, and triggering a read access or write access to the second memory bitcell means via the shared pair of bitline means during a second portion of said clock cycle of the clock signal.

16. A method of operating a ternary content addressable memory (TCAM) cell comprising first and second memory bitcells configured to store first and second bit values representing a cell state comprising one of a first cell state, a second cell state and a mask cell state; a shared pair of bitlines shared by the first and second memory bitcells for accessing the first and second bit values stored by the first and second memory bitcells; a pair of search lines for inputting first and second search values representing a search state comprising one of a first search state, a second search state and a mask search state; compare circuitry configured to generate a match value indicating a result of comparing the search state of the first and second search values with the cell state of the first and second bit values; and a match line configured to output the match value;
the method comprising:
receiving a clock signal;
triggering a read access or a write access to the first memory bitcell via the shared pair of bitlines during a first portion of a clock cycle of the clock signal, and
triggering a read access or write access to the second memory bitcell via the shared pair of bitlines during a second portion of said clock cycle of the clock signal.

* * * * *